(12) United States Patent
Fujimoto et al.

(10) Patent No.: US 7,737,460 B2
(45) Date of Patent: Jun. 15, 2010

(54) WHITE LED AND MANUFACTURING METHOD THEREFOR

(75) Inventors: Akira Fujimoto, Kawasaki (JP); Koji Asakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 11/349,986

(22) Filed: Feb. 9, 2006

(65) Prior Publication Data

US 2006/0186424 A1  Aug. 24, 2006

(30) Foreign Application Priority Data

Feb. 10, 2005 (JP) .............................. 2005-034581

(51) Int. Cl.
*H01L 29/74* (2006.01)
(52) U.S. Cl. ........... 257/99; 257/E33.058; 257/E25.005
(58) Field of Classification Search .......... 257/79–103, 257/E33.027, E33.058, E25.005
See application file for complete search history.

(56) References Cited

U.S. PATENT DOCUMENTS

| | | | |
|---|---|---|---|
| 5,770,887 A * | 6/1998 | Tadatomo et al. ........... 257/613 |
| 6,066,861 A | 5/2000 | Hohn et al. | |
| 6,207,077 B1 | 3/2001 | Burnell-Jones | |
| 6,316,785 B1 * | 11/2001 | Nunoue et al. ................ 257/14 |
| 6,395,572 B1 | 5/2002 | Tsutsui et al. | |
| 6,784,463 B2 * | 8/2004 | Camras et al. ............... 257/99 |
| 6,825,056 B2 * | 11/2004 | Asakawa et al. ............. 438/47 |
| 6,853,010 B2 * | 2/2005 | Slater et al. .................. 257/98 |
| 7,132,786 B1 | 11/2006 | Debray et al. | |
| 2002/0115229 A1 | 8/2002 | Tsutsui et al. | |
| 2003/0123495 A1 * | 7/2003 | Cox ............................ 372/20 |
| 2003/0178626 A1 * | 9/2003 | Sugiyama et al. ............. 257/79 |
| 2004/0041164 A1 * | 3/2004 | Thibeault et al. .............. 257/98 |
| 2006/0056474 A1 * | 3/2006 | Fujimoto et al. ......... 372/43.01 |

FOREIGN PATENT DOCUMENTS

AO          2003-218383           7/2003

(Continued)

OTHER PUBLICATIONS

U.S. Appl. No. 11/220,637, filed Sep. 8, 2005, Akira Fujimoto, et al.

(Continued)

*Primary Examiner*—Kimberly D Nguyen
*Assistant Examiner*—Alexander Belousov
(74) *Attorney, Agent, or Firm*—Oblon, Spivak, McClelland, Maier & Neustadt, L.L.P.

(57) ABSTRACT

A white LED includes an LED chip formed on one main surface of a sapphire substrate, the LED chip being formed in a semiconductor stack structure including a light emitting layer and emitting light of a predetermined wavelength, a light extracting film applied on the other main surface of the substrate, the light extracting film being formed of a material having a refractive index within a range of ±5% of a refractive index of the substrate and a surface of the light extracting film that is located on an opposite side to the substrate being processed into a recess and projection shape, and a phosphor member provided on an opposite side of the substrate with respect to the light extracting film, and generating white light as light is incident thereon.

2 Claims, 6 Drawing Sheets

FOREIGN PATENT DOCUMENTS

| | | |
|---|---|---|
| EP | 1 095 998 A | 5/2001 |
| JP | 2000-299494 | 10/2000 |
| JP | 2001-151834 | 6/2001 |
| JP | 2002-319708 | 10/2002 |
| WO | WO 01/08453 A | 2/2001 |
| WO | WO 01/60943 A | 8/2001 |
| WO | WO 03/100873 A1 | 12/2003 |

OTHER PUBLICATIONS

Yoshiaki Kanamori, et al., "Broadband Antireflection Gratings for Glass Substrates Fabricated by Fast Atom Beam Etching", Japanese Journal of Applied Physics, vol. 39, Part 2, No. 7B, Jul. 15, 2000, pp. L735-L737.

U.S. Appl. No. 12/246,099, filed Oct. 6, 2008, Fujimoto, et al.

Extended European Search Report Issued in Patent Application No. 08014529.5-2111 dated on Dec. 12, 2008.

\* cited by examiner

WHITE LED AND MANUFACTURING METHOD THEREFOR

CROSS-REFERENCE TO RELATED APPLICATIONS

This application is based upon and claims the benefit of priority from prior Japanese Patent Application No. 2005-034581, filed Feb. 10, 2005, the entire contents of which are incorporated herein by reference.

BACKGROUND OF THE INVENTION

1. Field of the Invention

The present invention relates to a white LED (light emitting diode), and more specifically to a white LED with an improved light extracting section, and a method of manufacturing the LED.

2. Description of the Related Art

White LEDs that use sapphire ($Al_2O_3$) as a substrate have such a structure that an LED that emits UV light is formed on one of the main surfaces of the substrate and phosphor is arranged on the other main surface of the substrate. With this structure, UV light is converted by phosphor into white light. In the white LEDs of this type, a refractive index of sapphire, which serves as the substrate, is high as 1.76, and therefore the problem of loss of light due to reflection on a surface of substrate and on an interface arises. For this reason, only about 32% of light can be extracted between sapphire and air. Thus, it is difficult to efficiently extract light created inside the element to the outside.

In order to increase the light extracting efficiency of LED, there has been an attempt of increasing the transmittance by forming a regularly arranged structure (of recesses and projections) of a nanometer size on a surface of the light emitting element (Applied Physics Letters, 142, vol. 78, 2001, Jpn. J. Appl. Phys., L735, vol. 39, 2000). In this attempt, since the recesses and projections of the structure are arranged in nanometer size, the recess and projection region serves as such a layer that the refractive index smoothly changes from the surface of semiconductor to the air, for light. Therefore, the reflection does not occur, but light is completely passed through the layer.

On the other hand, in order to make a coarse surface, there is a conventionally known technique in which the surface is treated with hydrochloric acid, sulfuric acid, hydrogen peroxide or a mixture of these (Jpn. Pat. Appln. KOKAI Publication No. 2000-29949). According to this technique, recesses and projections of micron-sizes are formed by the surface treatment, and thus the multiple scattering on the recesses and projections is utilized to extract as much light as possible.

However, it is difficult to form excellently configured recesses and projections in a surface of sapphire by a technique described above. That is, sapphire is a very difficult material to etch, and therefore sapphire cannot be processed by a dry etching method using a resist mask sufficiently as desired. Even if the optimal etching gas is selected, the ratio in the etching rate with respect to the resist is about only 1 at best. For this reason, it is difficult to form a desired recess and projection configuration, especially, a recession and projection shape having a high aspect ratio of a size of a sub-micron order.

As described above, with the conventional technique, it is not possible to form an excellent recess and projection shape in a surface of a sapphire substrate, which has been a factor of lowering the light extracting efficiency in the white LED.

BRIEF SUMMARY OF THE INVENTION

According to an aspect of the present invention, there is provided a white light emitting diode (LED) comprising:

a sapphire substrate having a first main surface and a second main surface located on an opposite side to the first main surface;

a light emitting diode (LED) chip formed on the first main surface of the substrate, the LED chip being fabricated in a semiconductor stack structure including a light emitting layer and emitting light of a predetermined wavelength;

a light extracting film formed on the second main surface of the substrate, the light extracting film being formed of a material having a refractive index within a range of ±5% of a refractive index of the substrate, and having a surface located on an opposite side to the substrate and processed into a recess and projection shape; and a phosphor member provided on the light extracting film on an opposite side thereof to the substrate, the phosphor member generating white light due to light incident thereon through the light extracting film.

According to another aspect of the present invention, there is provided a white light emitting diode (LED) comprising:

a sapphire substrate having a first main surface and a second main surface located on an opposite side to the first main surface;

a light emitting diode (LED) chip formed on the first main surface of the substrate, the LED chip being fabricated in a semiconductor stack structure including a light emitting layer and emitting light of a predetermined wavelength;

a light extracting film formed on the second main surface of the substrate, the light extracting film being formed of a material having a refractive index within a range of ±5% of a refractive index of the substrate, and having a surface located on an opposite side to the substrate and including a plurality of projections, each of the plurality of projections including a conical mesa portion having a gradient refractive index structure, a cylindrical portion having a gating and a conical portion having a gradient refractive index structure in this order from the substrate side; and a phosphor member provided on the light extracting film on an opposite side thereof to the substrate, the phosphor member generating white light due to light incident thereon through the light extracting film.

According to still another aspect of the present invention, there is provided a method of manufacturing a white light emitting device (LED), comprising:

forming a light emitting diode (LED) chip of a semiconductor stack structure including a light emitting layer, on a first main surface of a sapphire substrate;

forming a thin film having a refractive index within a range of ±5% of a refractive index of the substrate, on a second main surface of the substrate, which is located on an opposite side to the first main surface;

forming a mask in which circular patterns are periodically arranged, on the thin film;

forming a light extracting film having a recess and projection shape by selectively etching the thin film with a reactive ion etching method using the mask; and forming a phosphor film that generates white light due to light incident thereon, on the light extracting film.

According to still another aspect of the present invention, there is provided a method of manufacturing a white light emitting diode (LED), comprising:

forming a light emitting diode (LED) chip of a semiconductor stack structure including a light emitting layer, on a first main surface of a sapphire substrate;

forming a thin film having a refractive index within a range of ±5% of a refractive index of the substrate, on a second main surface of the substrate, which is located on an opposite side to the first main surface;

forming a mask in which circular patterns are periodically arranged, on the thin film;

forming a plurality of cylindrical portions of projection structures by selectively etching the thin film with a reactive ion etching method using the mask;

forming a mesa portion in a bottom portion of each of the plurality of cylindrical portions and a conical portion at a top of each of the plurality of cylindrical portions by etching the thin film by a physical etching method using an inert gas after removing the mask; and forming a phosphor film that generates white light due to light incident thereon, on the thin film in which the cylindrical portions, the mesa portions and the conical portions are formed.

According to still another aspect of the present invention, there is provided a method of manufacturing a white light emitting diode (LED), comprising:

forming a light emitting diode (LED) chip of a semiconductor stack structure including a light emitting layer, on a first main surface of a sapphire substrate;

forming a plurality of columnar patterns on a second main surface of the substrate, which is located on an opposite side to the first main surface;

burying gaps between the plurality of columnar patterns with a thin film having a refractive index within a range of ±5% of a refractive index of the substrate;

forming a light extracting film made of the thin film and having a recess and projection shape by annealing the thin film after removing the plurality of columnar patterns; and forming a phosphor film that generates white light as light is incident thereon, on the light extracting film.

DETAILED DESCRIPTION OF THE INVENTION

Details of the present invention will now be described with reference to embodiments illustrated in accompanying drawings.

Figure 1:
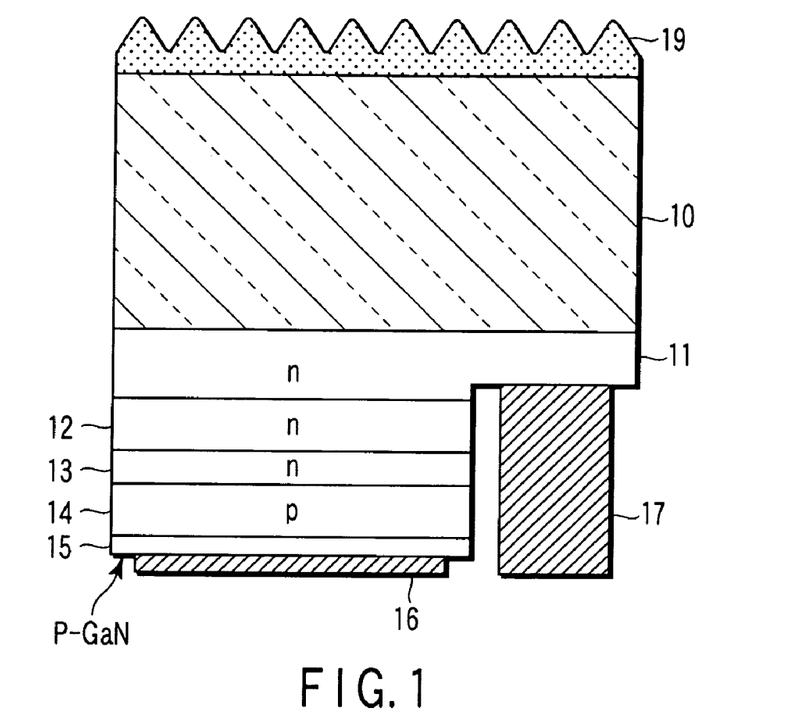
FIG. 1 is a diagram showing a cross section of a main structure of a white LED according an embodiment of the present invention.

FIG. 1 is a diagram showing a cross section of a main structure of a white LED according an embodiment of the present invention.

An n-AlGaN contact layer 11, an n-AlGaN clad layer 12, an n-AlGaN active layer (SL active layer) 13, a p-AlGaN clad layer (SL clad layer) 14 and a p-GaN contact layer 15 are formed on a main surface (first surface) of a sapphire (monocrystalline $Al_2O_3$) substrate 10. Then, a p-electrode 16 is formed on the p-side contact layer 15, and an n-side electrode 17 is formed on the n-side contact layer 11. The thus obtained structure is diced into chips to prepare light-emitting elements. The light generated from the active layer 13 is extracted from an opposite surface (the second main surface) of the sapphire substrate 10, on which an LED is not formed. In this embodiment, the wavelength of the light emitted from the LET itself is in a UV region (300 to 400 nm).

Up to here, the basic structure of the present invention is substantially the same as the conventional white LED. Further, in this embodiment, a thin film made of a material of a refractive index about the same as that of sapphire is attached as a light extracting film 19 on the other main surface (second main surface) of the sapphire substrate 10, and the recess and projection configuration is formed in the surface of the thin film.

Figure 2:
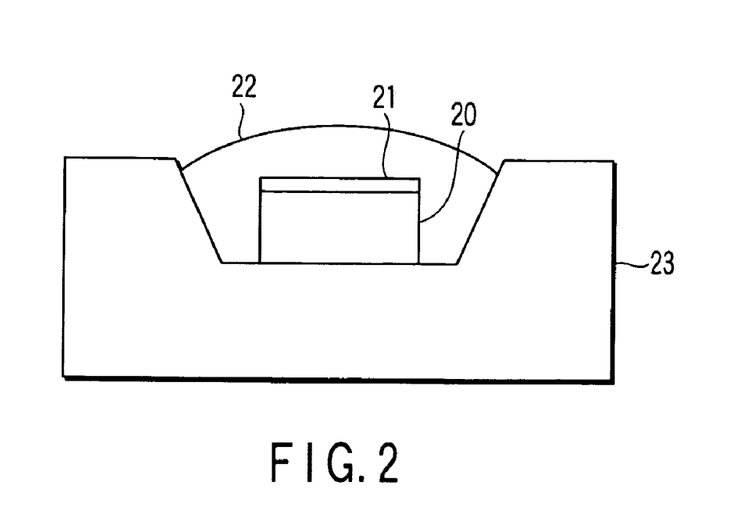
FIG. 2 is a diagram showing a cross section of an entire structure of a white LED according the embodiment of the present invention.

It should be noted here that an actual white LED has such a structure as shown in FIG. 2 that a phosphor member 21 for white light is formed as a thin film on a light-emitting surface side (rear surface side of the substrate 10) of an LED 20 having a structure shown in FIG. 1, and these members are sealed with an epoxy resin 22. Then, UV light from the LED 20 is applied to the phosphor member 21 to emit white light.

[Method of Manufacturing Light-Emitting Element]

Next, a method of manufacturing a white LED, especially, a method of preparing the light extracting section, will now be described.

For the method of forming a necessary recess and projection pattern in the light extracting surface, an ordinary photolithography exposure device or electron beam lithography device can be used. Further, it is also possible to employ a method that utilizes a micro-phase separation structure that employs block copolymers developed by the inventors of the present invention. (See Jpn. Pat. Appln. KOKAI Publication No. 2001-151834; to be referred to as Document A hereinafter.) Apart from the above, there is further a manufacturing method that uses polymer beads, silica beads, etc. as the mask. (See Applied Physics Letters, 2174, vol. 63, 1993).

First, the method of Document A will be described.

Figure 3A:
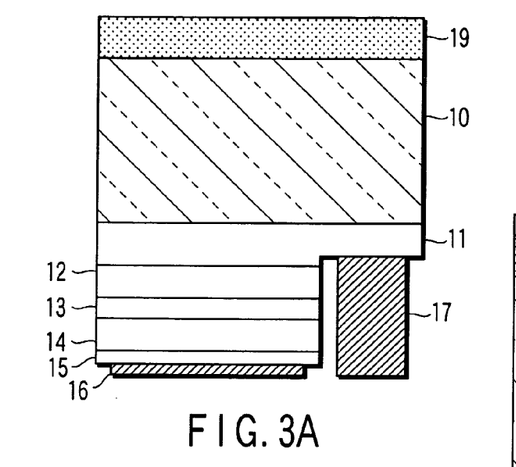
FIGS. 3A to 3D each are a diagram showing a cross section of a white LED according to the embodiment at a respective step in its manufacture, designed to explain a method that utilizing a micro-phase separation structure with use of a block co-polymer.

As shown in FIG. 3A, an n-$Al_{0.4}Ga_{0.6}N$ (contact layer) 11, an n-$Al_{0.35}Ga_{0.65}N$ (clad layer) 12, an n-$Al_{0.28}Ga_{0.72}N$/n-$Al_{0.24}Ga_{0.76}N$ (SL active layer) 13, a p-$Al_{0.4}Ga_{0.6}N$/p-$Al_{0.3}Ga_{0.7}N$ (SL clad layer) 14 and a p-GaN (contact layer) 15 are formed in this order by growing them on one main surface of a sapphire substrate 10 by a MOCVD process. Then, the contact layer 15 to the clad layer 12 are selectively removed to expose a part of the contact layer 11. After that, a p-side electrode 16 is formed on the contact layer 15, and an n-side electrode 17 is formed on a further exposed contact layer 11. Thus, a UV-LED is prepared. Subsequently, an SiON film 19, which serves as a light extracting film, is formed on the other main surface of the sapphire substrate 10 by a plasma CVD method.

Next, a solution prepared by dissolving block copolymers, which are micro phase separation structure compositions, into a solvent are applied by spin coating on an SiON-attached sapphire substrate having a structure shown in FIG. 3A. After that, the solvent is vaporized by pre-baking and thus a mask material layer 31 is formed on the SiON film 19. Subsequently, the layer is annealed in a nitrogen atmosphere to carry out phase separation of the block polymers.

Figure 3B:
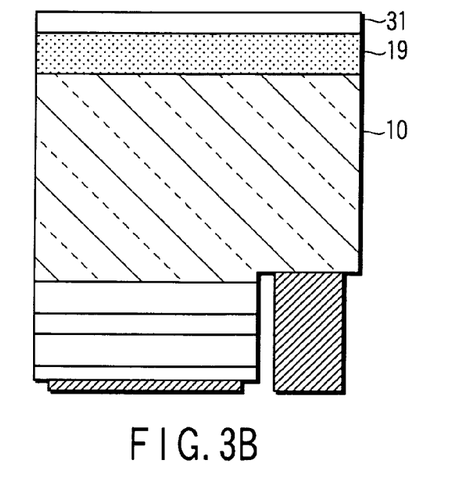
Figure 3C:
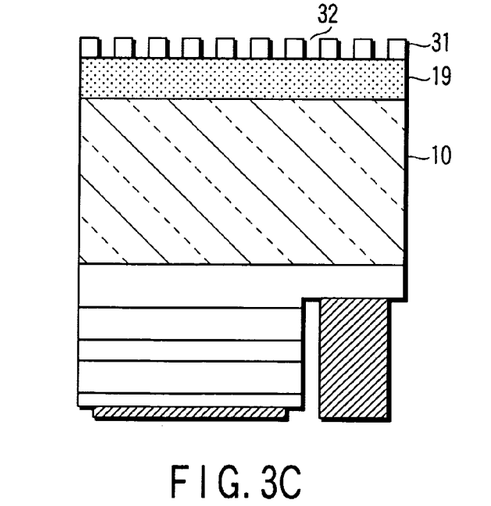

Next, the phase-separated block copolymer-attached substrate is dry etched by RIE using an etching gas, and thus the block copolymer of the phase-separated film are etched. The block copolymer contains a plurality of polymer fragments. Due to the difference in etching rate between these polymer fragments, the phase of one of the polymer fragments is selectively etched. Therefore, a micro pattern 32 as shown in FIG. 3C remains.

After that, the pattern 32 of the polymer fragment remaining without being removed by the etching is used as a mask, and the SiON film 19 is dry etched by RIE using an appropriate etching gas. Thus, a micro recess and projection pattern is formed in the SiON film 19. SiON can be etched with a gas such as of $CF_4$, $CHF_3$ and $Cl_2$. After that, the remaining polymer fragment is removed with an $O_2$ asher, and thus a structure having a recess and projection pattern on its light extracting surface can be obtained.

In the meantime, a manufacturing method that a mask made of PS fine particles as polymer beads will now be described.

Figure 4A:
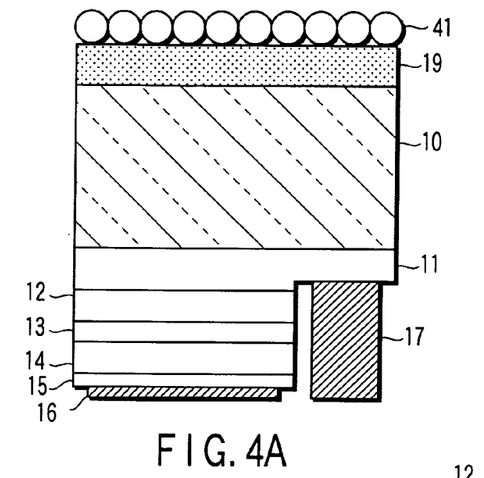
FIGS. 4A and 4B each are a diagram showing a cross section of a white LED according to the embodiment at a respective step in its manufacture, designed to explain a method that uses a mask made of PS fine particles as polymer beads.

Up to the step of forming an SiON-attached white LED substrate, the manufacturing process is the same as that shown in FIG. 3A already described. Then, the white LED substrate having the structure shown in FIG. 3A is immersed in an aqueous solution in which PS particles having a diameter of 200 nm are mono-dispersed. After that, the substrate is gradually lifted out of the solution. While lifting the substrate, a so-called meniscus line is created where the surface of the substrate, the surface of the solution and the air meet at an interface. Along the meniscus line, PS particles are attracted to the surface of the substrate, and the PS particles are arranged as a mono-molecular layer on the surface of the substrate. As a result, a pattern 41 of PS fine particles is formed as shown in FIG. 4A.

Figure 4B:
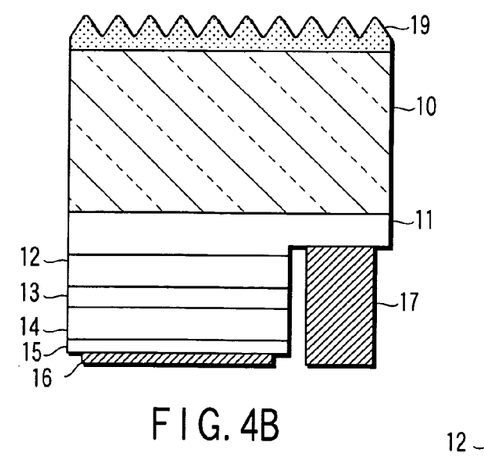

Next, as shown in FIG. 4B, the SiON film 19 is dry etched by RIE with an appropriate etching gas using the pattern 41 of PS fine particles as the mask. Thus, a micro recess and projection pattern is formed in the SiON film 19. After that, the remaining PS fine particles are removed with the $O_2$ asher, and thus a structure having a recess and projection pattern on its light extracting surface can be obtained.

Further, a manufacturing method by electron beam lithography will now be described.

Figure 5A:
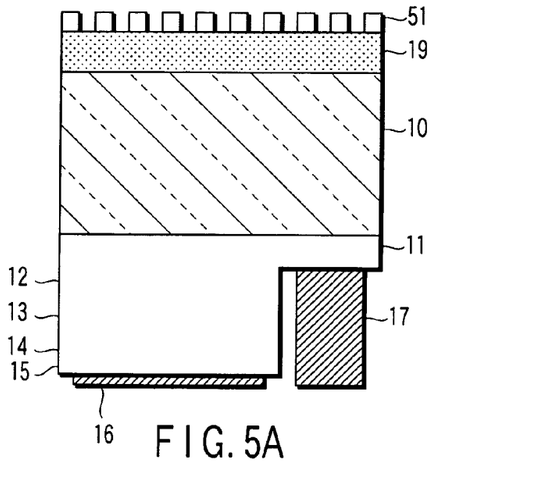
FIGS. 5A and 5B each are a diagram showing a cross section of a white LED according to the embodiment at a respective step in its manufacture, designed to explain a method that utilizes an electron beam lithography.

Up to the step of forming an SiON-attached white LED substrate, the manufacturing process is the same as that shown in FIG. 3A already described. According to this method, first, an electron beam resist is applied on the SiON film 19 and thus a resist pattern in which circular patterns having a diameter of 150 nm are arranged at predetermined intervals is generated with use of an electron beam exposure device equipped with a pattern generator and having an acceleration voltage of 50 kV, as shown in FIG. 5A.

Figure 5B:
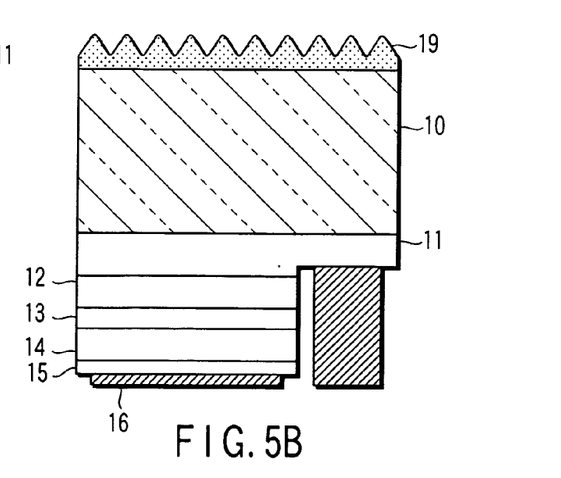

Next, as shown in FIG. 5B, the SiON film 19 is dry etched by RIE with an appropriate etching gas using the resist pattern 51, and thus a micro recess and projection pattern is formed in the SiON film 19. After that, the remaining resist is removed with an $O_2$ asher, and thus a structure having a recess and projection pattern on its light extracting surface can be obtained.

If a photolithography method that uses excimer laser light such as $F_2$, ArF or KrF, or emission light of mercury light such as i-ray or g-ray in place of electron beam is employed, the same results can be obtained.

Although the present invention is not limited to the following method, the etching method that utilizes the micro-phase separation structure of block copolymers will be discussed in more detail.

[Micro-Phase Separation Structure Formable Resin Composition]

A thin film of block copolymers or graft copolymers is formed to have a micro phase separation (phase separation in a molecule of block copolymer), and then one polymer phase is selectively removed. Thus, a porous film having a pattern of nanometer size is formed. The porous film thus obtained can be used as a mask used to transfer a pattern by etching the base material. In order to selectively remove one polymer phase from the micro phase separation structure, the difference in dry etching rate, the difference in resolution to energy line, or the difference in thermal decomposition property between two polymer phases is utilized. In either case, it is not necessary to use the lithography technique, and therefore a high throughput can be achieved, thereby making possible to lower the production cost.

[Formation of Micro-Phase Separation Structure Formable Resin Composition]

In order to form a thin film made of a micro phase separation structure forming resin composition, it is preferable that an evenly dissolved solution of the resin composition should be applied on a surface of a light-emitting element. With use of the even solution, it is possible to prevent the remaining of the development history during the formation of the film. If micelles or the like having a relatively large grain diameter are created in the solution and the coating solution becomes uneven, irregular phase separation structures are mixedly present in the solution. For this reason, it is difficult to form regular patterns and it takes a great amount of time to form regular patterns, which is not desired.

The solvent that dissolves block copolymers, which are the micro phase structure forming resin compositions, should desirably be a good solvent for the two types of polymers that constitute the block copolymers. The repulsive force between polymer chains is proportional to a square of the difference in the solubility parameter between the two types of polymers. Therefore, when a solvent good for both of the two types of polymers is used, the difference in the solubility parameter between the two types of polymers becomes small, and therefore the free energy in the system becomes small, which is advantageous for the phase separation.

In the case where a thin film of the block copolymers is formed, it is preferable in order to be able to prepare an even solution that a solvent having a boiling point high as 150° C. or higher, such as ethyl cellosolve acetate (ECA), propyleneglycolmonomethyletheracetate (PGMEA) or ethyl lactate (EL) should be used.

The thickness of the formed thin film of the micro phase separation structure forming composition should preferably be in a range from approximately the same as the equivalent circular average diameter of the recess and projection configuration of the target surface to its triple value. If the thickness of the film falls out of the range, it is very difficult to obtain a projection structure having a desired average diameter.

[Formation of the Micro Phase Separation Structure]

The micro phase separation structure of block copolymers or graft copolymers can be prepared by the following method. For example, block copolymers or graft copolymers are dissolved into an appropriate solvent to prepare a coating solution, and the coating solution is applied on a substrate. Then, the solution is dried and thus a film is formed. The film thus obtained is annealed at a glass transition temperature of the polymers or higher, and thus a good phase separation structure can be formed. The following methods are alternatively possible. That is, the copolymers are molten, and then annealed at a temperature equal to the glass transition temperature or higher but not higher than a phase transition temperature. Thus, a micro phase separation is obtained, and then the micro phase separation structure is fixed at room temperature. It is possible that the solution of the copolymers is slowly cast thereby forming a micro phase separation structure. It is further possible that the copolymers are molten, and then formed into a desired shape by a hot press method, an injection molding, a transfer molding or the like, followed by annealing, thus forming a micro phase separation structure.

Means for forming a structure member of a nanometer size using thus formed micro phase separation structure, are discussed in detail in Document A, and the means can be employed in the embodiments of the present invention as well.

A pattern transfer method is effective, which is also discussed in detail in Document A, and this method can be employed in the embodiments as well. More specifically, on a substrate of a compound semiconductor, a layer (pattern transfer layer) having an etching resistance different from that of the substrate is applied, and further a block copolymer layer is applied. Here, for the pattern transfer layer, any of the materials indicated in Document A, for example, SOG (Spin On Glass).

The block copolymer layer is etched in a dry or wet manner to selectively remove only one phase of the block copolymer, thereby forming a recess and projection pattern. Then, the pattern transfer layer is etched using this pattern made of the organic material polymer as the mask. If, for example, a fluorine-based, chlorine-based or bromine-based gas is used, a pattern transfer layer made of SOG or the like can be etched using the organic material as the mask.

In this manner, the micro phase separation pattern of the block copolymer can be transferred to the pattern transfer layer. Then, the substrate is etched using this pattern transfer layer on which the pattern was transferred, as the mask.

The above-described method is effective for etching of a compound that contains metal which cannot be allow some etching selection ratio with respect to a carbon-based polymer material. Further, when a plurality of pattern transfer layers are used, and materials of etching resistances different from each other are laminated, it is further possible to obtain a pattern having a high aspect ratio.

As described above, according to this embodiment of the present invention, it is possible to easily form an excellent recess and projection shape on the surface of the sapphire substrate, making it possible to increase its brightness.

The present invention will now be described in further detail with reference to examples.

EXAMPLE 1

The structure of an LED of this example is similar to that shown in FIG. 1 described above. The LED of this example emits UV light.

An n-$Al_{0.4}Ga_{0.6}N$ (contact layer) 11, an n-$Al_{0.35}Ga_{0.65}N$ (clad layer) 12, an n-$Al_{0.28}Ga_{0.72}N$/n-$Al_{0.24}Ga_{0.76}N$ (SL active layer) 13, a p-$Al_{0.4}Ga_{0.6}N$/p-$Al_{0.3}Ga_{0.7}N$ (SL clad layer) 14 and a p-GaN (contact layer) 15 were formed on a sapphire (monocrystalline $Al_2O_3$) substrate 10. Then, p-electrodes 16 and n-electrodes 17 were formed on the contact layers 15 and 11, respectively.

Next, an SiON film 19 was deposited to have a thickness of 500 nm by a plasma CVD method on a side surface of the sapphire substrate 10 opposite to the LED chip. (See FIG. 3A.) The refractive index of the SiON film 19 was 1.76. Then, a solution was prepared by dissolving PS having a molecular weight of 315000, PMMA having a molecular weight of 785000 and block copolymer having an Mw/Mn value of 1.06 into PGMEA, and the obtained solution was applied on the above film by a spin coat method at 3000 rpm. After that, the solvent was vaporized by pre-baking at 110° C. for 90 seconds, and thus a mask material layer having a thickness of 150 nm was obtained. (See FIG. 3B.)

Next, the resultant was annealed in a nitrogen atmosphere at 180° C. for 4 hours, to induce phase separation between PS and PMMA. Thus, a dot pattern of polystyrene, which has a diameter of about 110 nm, was formed. After that, the resultant was dry etched by RIE under conditions of $O_2$=30 sccm, a pressure of 13.3 Pa (100 mTorr) and a power=100 W, and thus PMMA of the phase-separated PS-PMMA was selectively etched. As a result, flocculated polystyrene dots each having a size of about 0.1 μm in diameter remain at intervals of about 0.1 μm (FIG. 3C), and this layer is used as the mask for forming a recess and projection configuration on the SiON film 19.

Figure 3D:
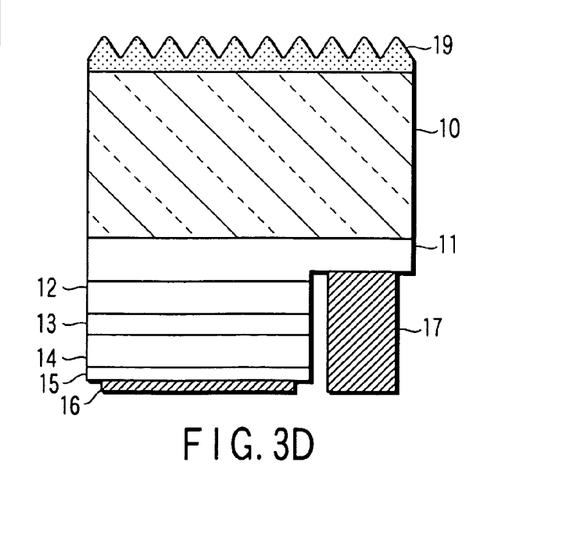

The sample thus obtained was dry etched by RIE under conditions of $CF_4$=30 sccm, a pressure of 30 mTorr and a power=100 W, for 5 minutes. In this manner, micro recesses and projections having an average diameter of 120 nm and an average height of 200 nm were formed in the SiON film 19. (See FIG. 3D.) The light emitting element of this example was compared with a light emitting element in which a recess and projection structure was not constructed in terms of the intensity of emission of UV light (λ=360 nm). The results indicated that the brightness of the element with the recess and projection structure was improved by about 20% as compared to the element without the recess and projection structure.

Next, phosphor members were mounted on a rear surface side of the substrate 10 (which is on the SiON film 19), which is opposite to the side of the light emitting diode (UV-LED) that emits UV light, manufactured in this example, and thus a white LED was formed. The phosphor members used here were as indicated in the following table.

| Phosphor member | Color: Wavelength | Composition ratio |
|---|---|---|
| ZnS: Cu, Al | Green: λ = 530 nm | 22.80% |
| $Y_2O_2S$: Eu | Red: λ = 626 nm | 55.80% |
| BaNgAl1017: Eu | Blue: λ = 454 nm | 21.40% |

Each of the above-indicated phosphor members was formed in a thin film-like fashion on the light-emitting surface of the LED, and the LED having the phosphor members on the light emitting surface was sealed with an epoxy resin. With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 20% higher as compared to the element without the recess and projection structure.

It is preferable that the recess and projection structure formed in the light-extracting layer 19 should preferably have such a structure that the intervals between adjacent recesses and projections are in a range of 50 nm to 1 μm and the heights thereof are in a range of 100 nm to 1 μm. Further, the refractive index of the light extracting film 19 should preferably be within a range of ±5% of the refractive index of sapphire, 1.76. Within this range, the loss of light at the interface of the sapphire light extracting film can be suppressed within 10%.

As described above, according to this example, the sapphire (monocrystalline $Al_2O_3$) substrate, which is the underlying substrate for forming a white LED, is processed such that a surface opposite to that on which an LED element is formed is coated with a thin film having a refractive index within a range of ±5% of the refractive index of sapphire and the recess and projection configuration is formed on the film. In this manner, it is possible to improve the light extraction efficiency of the white LED, thereby improving the brightness.

Note that it is difficult to form a recess and projection shape, especially, that having a high aspect ratio, by directly processing the sapphire substrate. However, it is possible to form, on sapphire, a material having a refractive index approximately the same as that of sapphire and process it to form recesses and projections in the material. In this manner, a recess and production shape having a high aspect ratio can be easily formed.

EXAMPLE 2

A substrate to which phase-separated block copolymers were attached was prepared by the same method as described in Example 1, and the substrate thus obtained was dry etched by RIE under conditions of $O_2$ flow=30 sccm, a pressure of 13.3 Pa (100 mTorr) and a power=100 W, and thus the phase-separated PS and PMMA were etched. By etching with $O_2$, it is not possible to each the substrate unlike the case of $CF_4$; however PMMA can be selectively etched.

After that, the sample thus obtained was dry etched by RIE under conditions of $CHF_3$ flow=30 sccm, a pressure of 30 mTorr and a power=100 W, for 8 minutes. In this manner, micro recesses and projections having an average diameter of 120 nm and an average height of 300 nm were formed in the SION film 19. (See FIG. 3D.) With use of $CHF_3$ as the etching gas, the selective ratio was improved, which allowed to perform the etching longer. Thus, recesses and projections having a high aspect ratio were obtained.

The light emitting element of this example was compared with a light emitting element in which a recess and projection structure was not constructed in terms of the intensity of emission of UV light ($\lambda$=360 nm). The results indicated that the brightness of the element with the recess and projection structure was improved by about 35% as compared to the element without the recess and projection structure.

Next, phosphor members were mounted on a rear surface side of the substrate 10 (, which is on the SiON film 19), which is opposite to the side of the light emitting diode (UV-LED) that emits UV light, manufactured in this example, and thus a white LED was formed as in Example 1. Each of the phosphor members was formed in a thin film-like fashion on the light-emitting surface of the LED (the figure shows the rear surface of the substrate), and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 30% higher as compared to the element without the recess and projection structure.

EXAMPLE 3

Figure 6A:
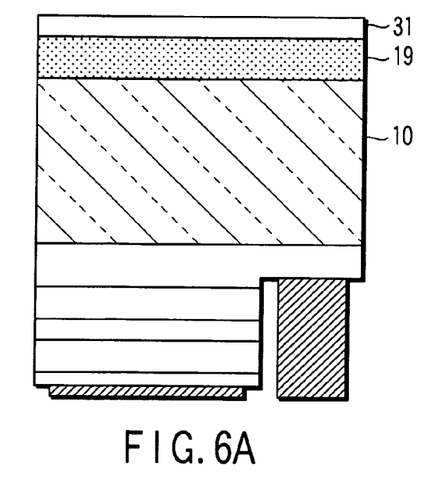
FIGS. 6A to 6D each are a diagram showing a cross section of a white LED at a respective step in its manufacture, designed to explain a method of manufacturing a white LED, according to the third embodiment of the present invention.

A substrate to which phase-separated block copolymers were attached was prepared by the same method as described in Example 1, and the substrate thus obtained was subjected to RIE under conditions of $O_2$ flow=30 sccm, a pressure of 13.3 Pa (100 mTorr) and a power=100 W, and thus the phase-separated PS and PMMA were etched as shown in FIG. 6A.

Figure 6B:
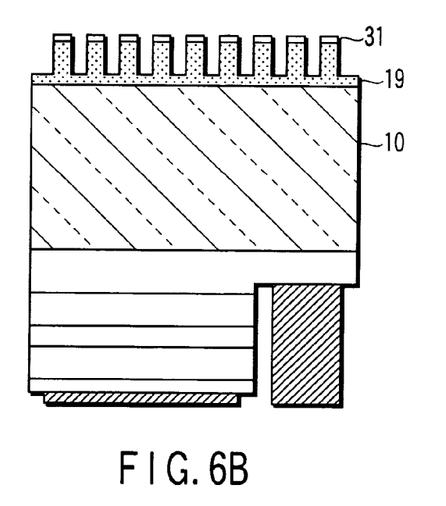

Next, the sample thus obtained was dry etched by RIE under conditions of $CHF_3$ flow=30 sccm, a pressure of 30 mTorr and a power=100 W, for 8 minutes. In this manner, a micro pattern 32 as shown in FIG. 6B was formed.

Figure 6C:
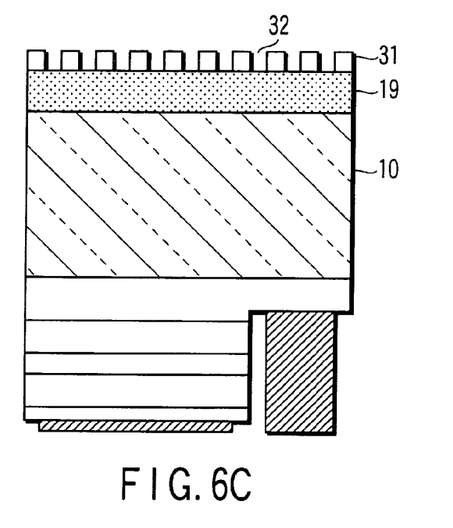

After that, the resultant sample was dry etched by RIE under conditions of $CF_4$ flow=30 sccm, a pressure of 30 mTorr and a power=100 W, for 12 minutes. In this manner, a cylindrical portion that forms a part of the projection structure was formed in the SiON film 19 as shown in FIG. 6C. After that, the resultant sample was ashing with oxygen to remove the polymers serving as the mask material layer 31.

Figure 6D:
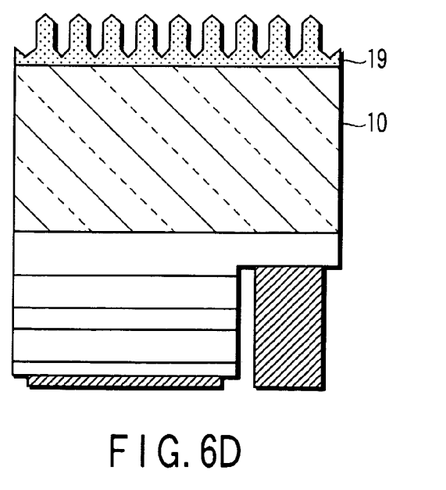

Further, the resultant sample was sputtered under conditions of Ar gas flow of 50 sccm, a pressure of 0.65 Pa (5 mTorr) and a power=300 W, for 60 seconds. In this manner, a top portion and bottom end portion of each cylindrical part were sputtered and thus a mesa portion and a cone portion were formed in each cylindrical part.

Thus, a micro projection structure containing a cone, a cylinder and a mesa portion was formed in the SiON film 19. It should be noted that the average diameter of the bottom parts of the mesa portions of the SiON film 19 was 160 nm, the average diameter of the top portions was 100 nm, and the average diameter of the mesa portions was 50 nm. The average diameter of the cylindrical parts was 100 nm, and the average height thereof was 200 nm. The average diameter of the cone portions was 100 nm, and the average height thereof was 60 nm. The interval between adjacent projections was 180 nm.

The light emitting element of this example was compared with a light emitting element in which a recess and projection structure was not constructed in terms of the intensity of emission of UV light ($\lambda$=360 nm). The results indicated that the brightness of the element with the recess and projection structure was improved by about 50% as compared to the element without the recess and projection structure.

Next, phosphor members were mounted on a rear surface side of the substrate 10, which is opposite to the side of the light emitting diode (UV-LED) that emits UV light, manufactured in this example, and thus a white LED was formed as in Example 1. Each of the phosphor members was formed in a thin film-like fashion on the light-emitting surface of the LED (the figure shows the rear surface of the substrate), and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 45% higher as compared to the element without the recess and projection structure.

As described above, according to the present invention, a micro projection structure containing cone portions, cylindrical parts and mesa portions was formed, and with this structure, the brightness was further improved.

Figure 7:
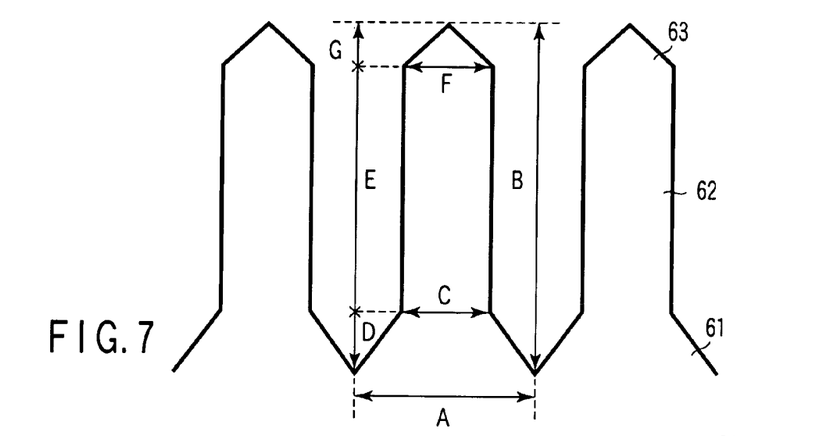
FIG. 7 is a diagram showing a cross section of a specific structure of a projection configuration.

It should be noted that each projection includes three parts, that is, from the bottom portion to the top, a mesa portion 61 that has a gradient refractive index structure, a cylindrical portion 62 that has a grating structure and a cone portion 63 that has a gradient refractive index structure, as shown in FIG. 7. With this structure, it is possible to improve the light extracting efficiency. Further, according to the results of the experiments carried out by the inventors of the present invention, a further improvement in efficiency was confirmed by setting the following conditions.

That is, the diameter of the bottom portion of the mesa portion 61 is about 200 nm, the diameter of the top portion is about 150 nm, the height of the mesa portion is about 100 nm, the diameter of the cylindrical part 62 is about 150 nm, the height thereof is about 200 nm, the diameter of the cone portion 63 is about 150 nm, and the height thereof is about 100 nm.

EXAMPLE 4

Figure 8A:
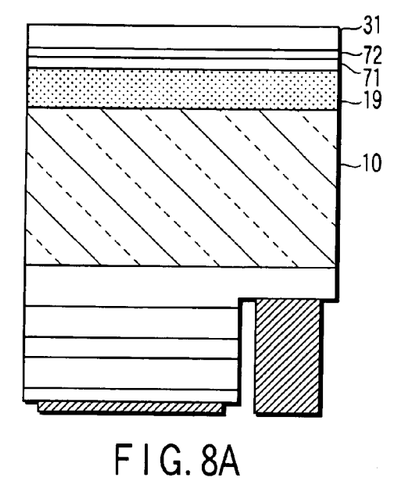
FIGS. 8A to 8D each are a diagram showing a section of a white LED at a respective step in its manufacture, designed to explain a method of manufacturing a white LED, according to the fourth embodiment of the present invention.

A three-layer resist (ARCXHRic-11 of Nissan Chemical Industries Co., Ltd) was applied on an SiON film 19 formed on a sapphire substrate 10, and a film 17 having a thickness of 500 nm was formed, as shown in FIG. 8A. The resultant was baked in an oven at 300° C. for 1 minute. Subsequently, a spin on glass 72 (SOG) (OCD T-7 of Tokyo Ohka Kogyo Co., Ltd.) was applied to have a thickness of 110 nm by spin coat, and the spin on glass was baked on a hot plate at 200° C. for 60 seconds, and further baked at 300° C. for 60 seconds. Then, a solution obtained by dissolving the same block copolymers into the same solvent as those of Example 1, was applied on the substrate at a rotation number of 3000 rpm. After that, the solvent was vaporized by pre-baking at 110° C. for 90 seconds and thus a mask material layer 31 was formed.

Figure 8B:
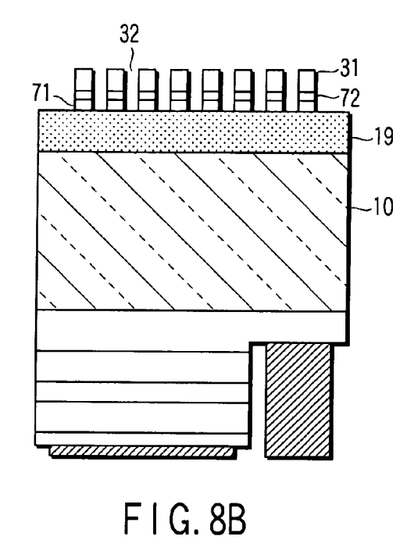

Subsequently, the substrate was annealed in a nitrogen atmosphere at 210° C. for 4 hours to carry out phase separation of the block polymers PS and PMMA. The substrate to which the phase-separated block copolymers were attached was dry etched by RIE under conditions of $O_2$ flow of 30 sccm, a pressure of 13.3 Pa (100 mTorr) and a power=100 W, and thus the phase-separated layers of PS and PMMA were etched. During the etching, PMMA was selectively etched due to the difference in the etching rate between PS and PMMA, and a pattern 32 of PS remained. With use of the PS pattern 32, the SOG film 72 was etched under conditions of $CF_4$ flow=30 sccm, a pressure of 1.33 Pa (10 mTorr) and a power=100 W. After that, the resultant sample was dry etched by RIE under conditions of $O_2$ flow of 30 sccm, a pressure of 1.33 Pa (10 mTorr) and a power=100 W. Thus, the underlying resist layer 71 was etched, thereby obtaining a columnar pattern having a height of 500 nm. Thus, a mask pattern as shown in FIG. 8B was formed.

Figure 8C:
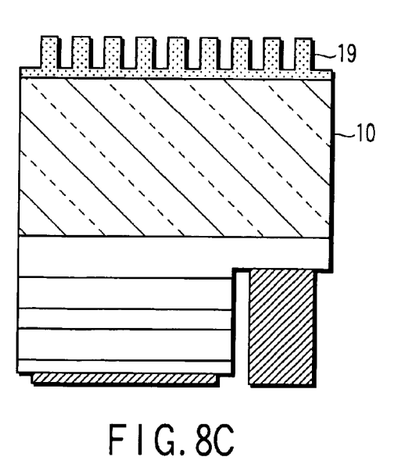

Subsequently, the resultant sample was dry etched under conditions of $CF_4$=30 sccm, a pressure of 30 mTorr and a power of 100 W, for 12 minutes, and thus columnar portions were formed in the SiON film 19. (See FIG. 8C.) Lastly, the sample was ashing with oxygen to remove the polymers. It should be noted here that the SOG was no longer there as etched with $CF_4$, before the removal of the polymers, and therefore the SOG did not create any problem here.

Figure 8D:
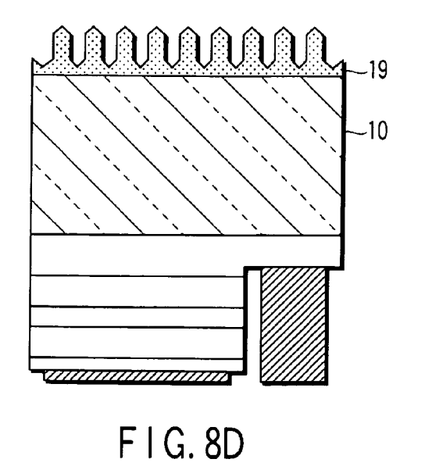

Next, as in Example 3, Ar sputtering was carried out for 3 minutes, and thus a micro recess and projection structure containing a cone, a cylinder and a mesa portion was formed as shown in FIG. 8D.

It should be noted that the average diameter of the bottom parts of the mesa portions of the SiON film 19 was 160 nm, the average diameter of the top portions of the mesa portions was 100 nm, and the average height of the mesa portions was 60 nm. The average diameter of the cylindrical parts was 100 nm, and the average height thereof was 250 nm. The average diameter of the cone portions was 100 nm, and the average height thereof was 70 nm. The interval between adjacent projections was 180 nm.

The light emitting element of this example was compared with a light emitting element in which a recess and projection structure was not constructed in terms of the intensity of emission of UV light ($\lambda$=360 nm). The results indicated that the brightness of the element with the recess and projection structure was improved by about 80% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface of the LED (the figure shows the rear surface of the substrate), and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 65% higher as compared to the element without the recess and projection structure.

As described above, according to the present invention, a micro projection structure containing cone portions, cylindrical parts and mesa portions of higher heights was formed, and with this structure, the brightness was further greatly improved.

EXAMPLE 5

An aluminum oxide solution (Kojundo Chemical Lab Co., Ltd) was applied by spin coat on a surface of a sapphire substrate 10 of the same LED as in Example 1. The resultant was baked at 120° C. for 1 minute. Subsequently, the resultant was annealed in an oxygen atmosphere at 400° C. for 1 hour. After the annealing, amorphous aluminum oxide was formed. The thickness of the formed film was 300 nm and the refractive index was 1.7. (See FIG. 3A.)

Next, the same block copolymers as those of Example 1 were formed. (See FIG. 3B.) Then, the substrate to which the phase-separated block copolymers were attached was dry etched by RIE under conditions of $O_2$ flow of 30 sccm, a pressure of 13.3 Pa (100 mTorr) and a power=100 W, and thus the phase-separated layers of PS and PMMA were etched. Thus, a pattern 32 of PS was formed. (See FIG. 3C.)

Next, with use of the PS pattern 32 as the mask, the resultant was dry etched by inductive coupled plasma (ICP) under conditions of $BCl_3/Cl_2$=5/20 sccm, a pressure of 0.266 Pa (2 mTorr) and an incident power/bias power=100/100 W for 2 minutes. Thus, micro recesses and projections having an average diameter of 120 nm and an average height of 200 nm were formed in the amorphous aluminum oxide layer. (See FIG. 3D.)

The light emitting element of this example was compared with a light emitting element in which a recess and projection structure was not constructed in terms of the intensity of emission of UV light ($\lambda$=360 nm). The results indicated that the brightness of the element with the recess and projection structure was improved by about 17% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface of the LED, and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 15% higher as compared to the element without the recess and projection structure.

EXAMPLE 6

A sol-gel solution of $SiO_2$(70%)-$TiO_2$(30%) was applied by spin coat on a surface of a sapphire substrate 10 of the same LED as in Example 1. The resultant was baked at 120° C. for 1 minute. Subsequently, the resultant was annealed in an oxygen atmosphere at 500° C. for 1 hour. After the annealing, a film was formed. The thickness of the formed film was 500 nm and the refractive index was 1.76. (See FIG. 3A.)

Next, the same block copolymers as those of Example 1 were formed. (See FIG. 3B.) Then, the substrate to which the phase-separated block copolymers were attached was dry etched by RIE under conditions of $O_2$ flow of 30 sccm, a pressure of 13.3 Pa (100 mTorr) and a power=100 W, and thus the phase-separated layers of PS and PMMA were etched. Thus, a pattern 32 of PS was formed. (See FIG. 3C.)

After that, the resultant was etched under conditions of $CHF_{3=30}$ sccm, a pressure of 30 mTorr and a power of 100 W for 8 minutes. Thus, micro recesses and projections having an average diameter of 120 nm and an average height of 200 nm were formed in the $SiO_2$—$TiO_2$ layer. With use of $CHF_3$ as the etching gas, the selection ratio was improved, which makes it possible to each for a long time. Therefore, high recesses and projections were formed.

The light emitting element of this example was compared with a light emitting element in which a recess and projection structure was not constructed in terms of the intensity of emission of UV light ($\lambda$=400 nm). The results indicated that the brightness of the element with the recess and projection structure was improved by about 25% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface (the figure shows the rear surface of the substrate) of the LED, and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 20% higher as compared to the element without the recess and projection structure.

EXAMPLE 7

A three-layer resist, SOG and block copolymer as those of Example 4 were formed on a surface of a sapphire substrate of the same LED as in Example 1. Subsequently, the resultant was annealed, and the phase separation of the block copolymer between PS and PMMA was induced.

Then, the substrate to which the phase-separated block copolymers were attached was dry etched by RIE under conditions Of $O_2$ flow of 30 sccm, a pressure of 13.3 Pa (100 mTorr) and a power=100 W, and thus the phase-separated layers of PS and PMMA were etched. During the etching, PMMA was selectively etched due to the difference in the etching rate between PS and PMMA, and a pattern of PS remained. With use of the PS pattern as the mask, the SOG film was etched under conditions of $CF_4$ flow=30 sccm, a pressure of 1.33 Pa (10 mTorr) and a power=100 W. After that, the resultant sample was dry etched by RIE under conditions of $O_2$ flow of 30 sccm, a pressure of 1.33 Pa (10 mTorr) and a power=100 W. Thus, the underlying resist layer 71 was etched, thereby obtaining a columnar pattern having a height of 500 nm.

Figure 9A:
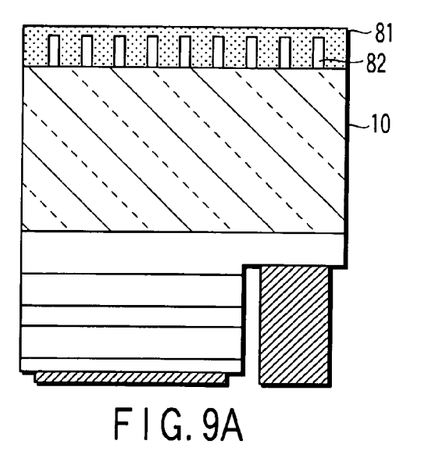
FIGS. 9A to 9C each are a diagram showing a section of a white LED at a respective step in its manufacture, designed to explain a method of manufacturing a white LED, according to the eighth embodiment of the present invention.

Subsequently, an yttrium oxide ($Y_2O_3$) solution was applied by spin coat and recess sections of the columnar sections were filled with the solution, as shown in FIG. 9A. The resultant was baked at 120° C. for 1 minute. Subsequently, the resultant was annealed in an oxygen atmosphere at 300° C. for 10 minutes. After the annealing, a $Y_2O_3$ film was formed. The refractive index of the formed film was 1.75.

Figure 9B:
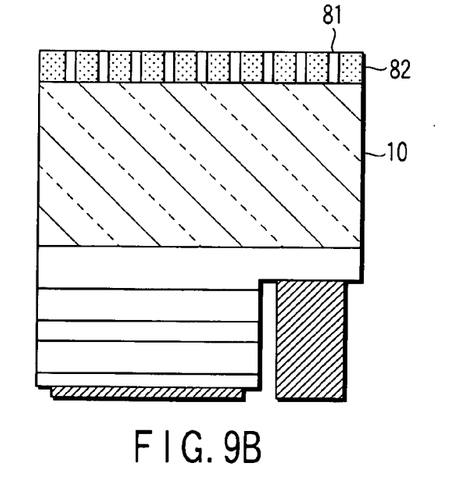

Next, the resultant was etched under conditions of $CF_4$=30 sccm, a pressure of 30 mTorr and a power of 100 W for 5 minutes, and thus upper surfaces of the columnar patterns 81 were exposed as shown in FIG. 9B.

Figure 9C:
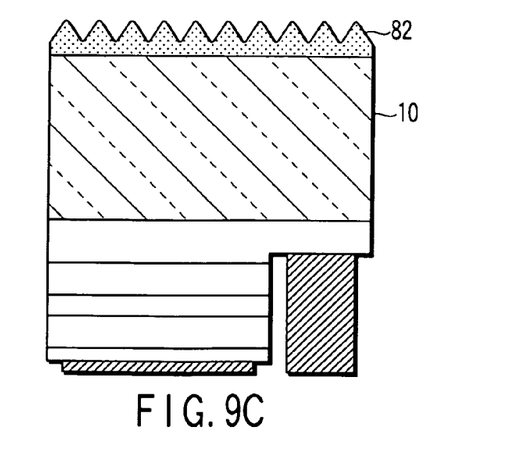

After that, ashing with oxygen was carried out to remove the columnar patterns 81. Lastly, the resultant was annealed under an oxygen atmosphere at 500° C. for 30 minutes. Thus, micro recesses and projections having an average diameter of 150 nm and an average height of 500 nm were formed in the $Y_2O_3$ layer 82 as shown in FIG. 9C.

The light emitting element of this example was compared with a light emitting element in which a recess and projection structure was not constructed in terms of the intensity of emission of UV light ($\lambda$=360 nm). The results indicated that the brightness of the element with the recess and projection structure was improved by about 50% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface (the figure shows the rear surface of the substrate) of the LED, and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 45% higher as compared to the element without the recess and projection structure.

This example employs the above-described process, and therefore a recess and projection configuration having a high aspect ratio can be easily obtained even with a material that is relatively difficult to etch.

EXAMPLE 8

A substrate of a light-emitting element in which SiON was formed on sapphire was immersed in an aqueous solution in which PS particles (having a density of 1.05) having a diameter of 300 nm are mono-dispersed as in Example 1. After that, the substrate was lifted out of the solution at a speed of 10 μm/sec under the conditions of a temperature of 25° C. and a humidity of 40%. While lifting the substrate, a so-called meniscus line is created where the surface of the substrate, the surface of the solution and the air meet at an interface. Along the meniscus line, PS particles are attracted to the surface of the substrate, and the PS particles are arranged as a mono-molecular layer on the surface of the substrate. (See FIG. 4A.)

The PS particle-attached substrate was etched under conditions of $CHF_3$=30 sccm, a pressure of 30 mTorr and a power of 100 W for 15 minutes. Thus, micro recesses and projections having an average diameter of 300 nm and an average height of 600 nm were formed in the SiON layer 19. (See FIG. 4B.) The light emitting element of this example was compared with a light emitting element in which a recess and projection structure was not constructed in terms of the intensity of emission of UV light (λ=360 nm). The results indicated that the brightness of the element with the recess and projection structure was improved by about 70% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface (the figure shows the rear surface of the substrate) of the LED, and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 65% higher as compared to the element without the recess and projection structure.

EXAMPLE 9

A substrate of a light-emitting element in which SiON was formed on sapphire was immersed in an aqueous solution in which silica particles (having a density of 2.0) having a diameter of 400 nm are mono-dispersed as in Example 1. After that, the substrate was lifted out of the solution in the same manner as in Example 8, and thus the silica particles are arranged as a mono-molecular layer on the surface of the substrate. (See FIG. 4A.)

The silica particle-attached substrate was etched under conditions of $CF_4$=30 sccm, a pressure of 30 mTorr and a power of 100 W for 15 minutes. Thus, micro recesses and projections having an average diameter of 400 nm and an average height of 600 nm were formed in the SiON layer 19. (See FIG. 4B.)

The light emitting element of this example was compared with a light emitting element in which a recess and projection structure was not constructed in terms of the intensity of emission of UV light (λ=360 nm). The results indicated that the brightness of the element with the recess and projection structure was improved by about 60% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface (the figure shows the rear surface of the substrate) of the LED, and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 55% higher as compared to the element without the recess and projection structure.

EXAMPLE 10

SiON was formed on sapphire and then an electron beam resist (FEP-301 of Fuji Photo Film Co. Ltd.) was formed thereon as in Example 1. Then, circular patterns each having a diameter of 150 nm were created in the resist film with an electron bean exposure device equipped with a pattern generator and having an acceleration voltage of 50 kV. (See FIG. 5A.)

The substrate thus obtained was etched under conditions of $CHF_3$=30 sccm, a pressure of 30 mTorr and a power of 100 W for 7 minutes. Thus, micro recesses and projections having an average diameter of 150 nm and an average height of 250 nm were formed in the SiON layer 19. (See FIG. 5B.)

The light emitting element of this example was compared with a light emitting element in which a recess and projection structure was not constructed in terms of the intensity of emission of UV light (λ=360 nm). The results indicated that the brightness of the element with the recess and projection structure was improved by about 25% as compared to the element without the recess and projection structure.

Next, phosphor members were mounted on a rear surface side of the substrate, which is opposite to the side of the light emitting diode (UV-LED) that emits UV light, manufactured in this example, and thus a white LED was formed as in Example 1. Each of the phosphor members was formed in a thin film-like fashion on the light-emitting surface (the figure shows the rear surface of the substrate) of the LED, and the LED having the phosphor members on the light emitting surface was sealed with an epoxy resin.

With use of the same phosphor members, an LED in which a recess and projection structure was not formed in its light emitting surface and an LED in which a recess and projection structure was formed in its light emitting surface were compared to each other in terms of the intensity of emission of white light. The results indicated that the brightness of the element with the recess and projection structure was about 20% higher as compared to the element without the recess and projection structure.

ALTERNATIVE EXAMPLES

The present invention is not limited to each of the above-described examples. The structure of the LED chip formed on the sapphire substrate is not at all limited to FIG. 1 described above, but it can be appropriately modified in accordance with a required specification. Further, as the material for the light extracting film, various types of materials having a refractive index similar to that of sapphire (n=1.76) can be used. For example, SiON, MgO, $Y_2O_3$, $Sm_2O_3$, $Nd_2O_3$, $Gd_3O_2$, amorphous $Al_2O_3$ and $SiO_2$—$TiO_2$ can be used. These materials have a higher etching rate as compared to that of sapphire (for example, SiON has an etching rate about 5 times higher in RIE with $CF_4$) and therefore these materials are easy to process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A white light emitting diode (LED) comprising:
a crystalline sapphire substrate having a first main surface and a second main surface located on an opposite side to the first main surface;
a light emitting diode (LED) chip formed on the first main surface of the substrate, the LED chip being fabricated in a semiconductor stack structure including a light emitting layer and emitting light of a predetermined wavelength;
a light extracting film formed on the second main surface of the substrate, the light extracting film being formed of a material having a refractive index within a range of ±5% of a refractive index of the substrate, and having a surface located on an opposite side to the substrate and processed into a recess and projection shape by having recesses extending into a portion of the light extracting film; and
a phosphor member provided on the light extracting film on an opposite side thereof to the substrate, the phosphor member generating white light due to light incident thereon through the light extracting film,
wherein the light extracting film is formed of an SiON film, a $Y_2O_3$ film, a MgO film, a $Sm_2O_3$ film, a $Nd_2O_3$ film, an amorphous $Al_2O_3$ film, or an $SiO_2$-$TiO_2$ film,
wherein an interval between adjacent projections of the recess and projection shape of the light extracting film is 50 nm to 1 μm and a height of each of the projections is 100 nm to 1 μm.

2. The white LED according to claim 1, wherein the LED chip emits UV light and the phosphor member converts UV light into white light.

* * * * *